United States Patent [19]

Tanagawa et al.

[11] Patent Number: 5,337,280
[45] Date of Patent: Aug. 9, 1994

[54] EEPROM CIRCUIT

[75] Inventors: Kouji Tanagawa; Kazuhiko Miyazaki, both of Tokyo, Japan

[73] Assignee: Oki Electric Industry Co., Ltd., Tokyo, Japan

[21] Appl. No.: 766,564

[22] Filed: Sep. 27, 1991

[30] Foreign Application Priority Data

Sep. 27, 1990 [JP] Japan ................ 2-258319
Sep. 27, 1990 [JP] Japan ................ 2-258320

[51] Int. Cl.⁵ .............................................. G11C 7/00
[52] U.S. Cl. ................................. 365/218; 365/189.04
[58] Field of Search ............ 365/218, 189.04, 189.01, 365/233, 201, 185

[56] References Cited
U.S. PATENT DOCUMENTS 4,279,024  7/1981  Schrenk .................... 369/218
4,803,662  2/1989  Tanaka ...................... 365/185
4,903,236  2/1990  Nakayama ............... 365/185
4,931,997  6/1990  Mitsuishi ................. 365/218
4,958,326  9/1990  Sakurai ..................... 365/218
5,097,446  3/1992  Shoji ......................... 365/218
5,111,427  5/1992  Kobayashi ............... 365/185

Primary Examiner—Eugene R. LaRoche
Assistant Examiner—A. Zarabian
Attorney, Agent, or Firm—Edward D. Manzo

[57] ABSTRACT

An EEPROM circuit has two memory transistors in a memory cell of an array. Stored data is read out to a reading circuit via a first and second complementary bit lines. A writing circuit provides voltage to the cell so that the first memory transistor writes data and the second memory transistor erases data. An erasing circuit does the converse, i.e. provides voltage to the cell so that the first memory transistor erases data and the second memory transistor writes data.

43 Claims, 6 Drawing Sheets

EEPROM CIRCUIT

BACKGROUND OF THE INVENTION

The present invention relates to an electrically erasable and programable random access read only memory (hereinafter called as an EEPROM).

A conventional EEPROM is disclosed in U.S. Pat. No. 4,901,320 (Literature I) or Japanese laid open publication 64-59693 (Literature II). Literature I relates to an error correction principle and its method, whereas Literature II relates to an EEPROM operable with low voltage and low current. An EEPROM circuit with high liability has recently been demanded. In other words, it has been desired to achieve an EEPROM circuit having relatively longer life time and less failure which can operate with low voltage and low current and can detect its failure.

SUMMARY OF THE INVENTION

An object of the present invention is to provide an EEPROM circuit, the memory cell of which has relatively longer life time.

Another object of the present invention is to provide an EEPROM circuit which has relatively less failure.

Still another object of the present invention is to provide an EEPROM circuit enabling higher speed writing and erasing operations.

A further object of the present invention is to provide an EEPROM circuit for detecting and informing failure or life time of memory cells.

A still further object of the present invention is to provide an EEPROM circuit for enabling more accurate read-out operation.

A still another object of the present invention is to provide an EEPROM circuit for reducing its occupying area.

To accomplish the above mentioned objects, there is disclosed an EEPROM circuit for storing data into a memory cell which employs a memory cell having a first and a second semiconductor memory elements for storing data; a first writing means for writing data into the first semiconductor memory element by providing high voltage; a second writing means for writing data into the second semiconductor memory element by providing high voltage; a reading means for reading data from the memory cell; the reading means reading respective data stored in the first and the second semiconductor memory elements through two bit lines; and a logic control means for controlling an operation of the memory cell by means of providing a signal for controlling a supply of the high voltage to the first and second writing means and the erasing means.

BRIEF DESCRIPTION OF DRAWINGS

In the accompanying drawings, there are shown illustrative embodiments of the invention from which these and other of its objectives, novel features, and advantages will be readily apparent.

In the drawings.

DETAILED DESCRIPTION OF THE PREFERRED EMBODIMENTS

Figure 1:
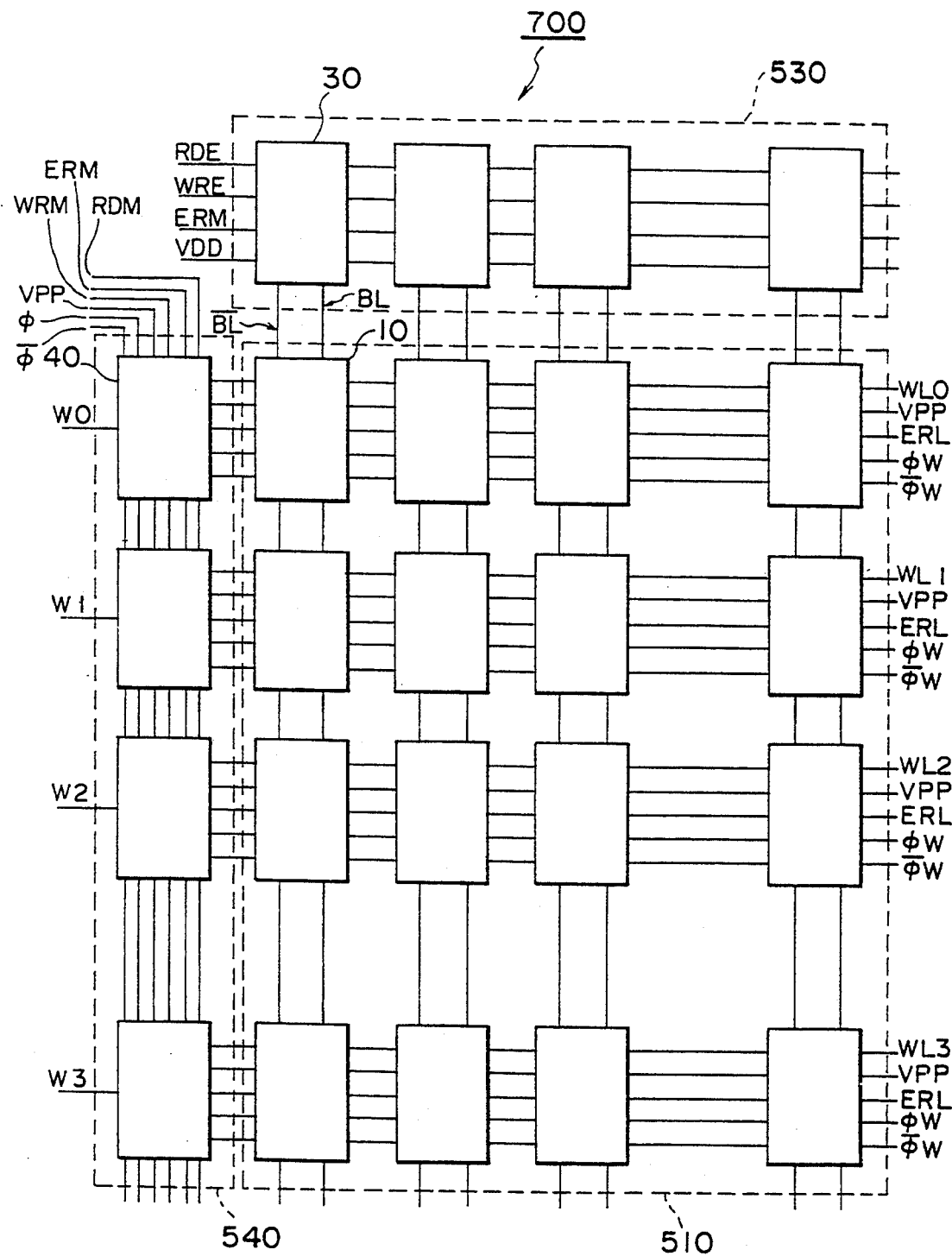
FIG. 1 is a schematic view illustrating a memory array of an EEPROM circuit in accordance with the present invention.

Referring now the attached drawings, detailed explanation will be made with respect to an EEPROM circuit utilizing the present invention. The EEPROM circuit 700 shown in FIG. 1 employs a memory cell portion 510 having a plurality of memory cells 10, a reading circuit portion 530 having a plurality of reading circuits 30 for reading data stored in the memory cells, and erasing circuit portion 540 having a plurality of erasing circuits 40 for erasing data stored in the memory cells by generating high voltage for erasing. Each of these circuits is set in array in vertical and horizontal directions to constitute the EEPROM circuit 700.

FIG. 1 shows one example array in which four rows of the memory cells 10 and the reading circuits 30, and four columns of the memory cells 10 and the erasing circuits 40 are set in array respectively in horizontal and vertical directions so that the EEPROM with 4 rows×4 columns(=16 bits) is constituted.

Figure 2:
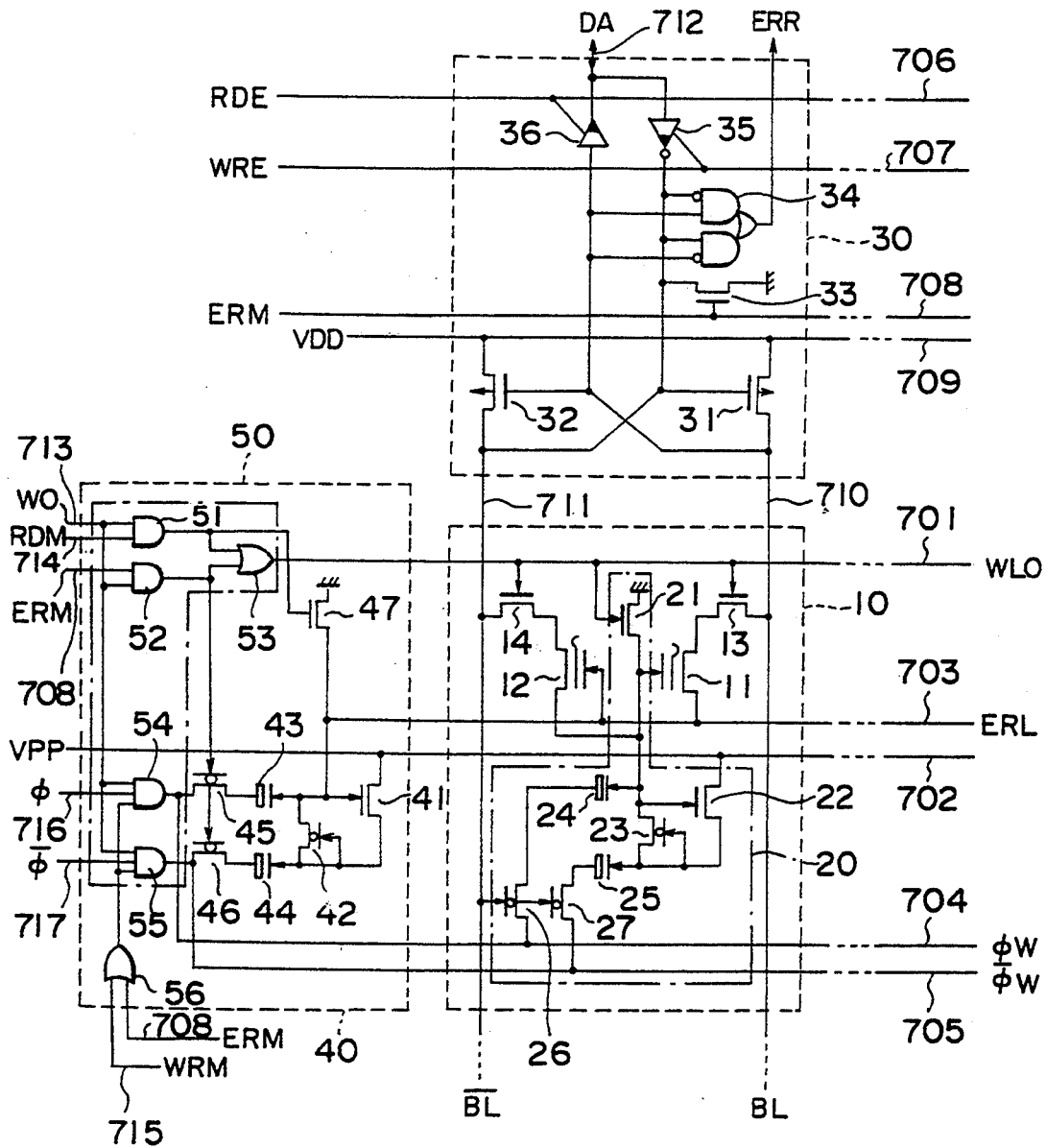
FIG. 2 is a partial circuit diagram illustrating the first embodiment of the present invention.

FIG. 2 shows a partial circuit diagram illustrating the EEPROM circuit 700 in FIG. 1.

The memory cell 10 is respectively connected to a word line 701, a high voltage supplying line 702, an erasure voltage supplying line 703 which provides high voltage VPP to the memory cell when the erasing operation is performed, and write clock pulse supplying lines 704 and 705 which provide write only clock pulses $\phi W$ and $\overline{\phi W}$.

The reading circuit 30, outputting an error signal ERR which informs deterioration and remaining life time of the memory cell, is respectively connected to a reading signal line 706 which provides a signal RDE for reading the data stored in the memory cell, a writing signal line 707 which provides a signal WRE for writing the data into the memory cell, an erase mode signal line 708 which provides a signal ERM for setting the circuit in erasable condition to the data stored in the memory cell, a power source voltage supplying line 709, bit fines 710 and 711, and a data bus line 712.

The erasing circuit 40, outputting the write clock pulses $\phi W$ and $\overline{\phi W}$, is respectively connected to a word line selective signal line 713 which provides a signal WO for selecting a word line to be accessed, a reading mode signal line 714 which provides a signal RDM for setting the circuit in readable condition to the data stored in the memory cell, a erasing mode signal line 708, a writing mode signal line 715 which provides a signal WRM for setting the circuit in writable condition to the data into the memory cell, the high voltage supplying line 702, the word line 701, the erasure voltage supplying line 703 and clock pulse supplying lines 716 and 717.

The memory cell 10 is constituted by floating type first and second memory transistors 11 and 12 for storing data, N channel type first and second selection transistors 13 and 14 for respectively controlling access to the memory transistors 11 and 12, and a writing circuit 20 for providing high voltage to the memory transistors 11 and 12. The memory transistor 11 is constituted such that the gate is connected to the source of the memory transistor 12 and the writing circuit 20, respectively. The memory transistor 12 is constituted such that the control gate is connected to the source of the memory transistor 11 and the erasure voltage supplying line 703. The drain of the memory transistor 11 is connected to the first bit line 710 through the selective transistor 13. The drain of the memory transistor 12 is connected to the second bit line 711 through the selective transistor 14. Both of the control gates of the selective transistors 13 and 14 are connected to the word line WL0.

The writing circuit 20 is constituted by N channel type FET transistors 21 and 22, zero threshold FET transistors 23, 26 and 27, and capacitors 24 and 25. The zero threshold FET is an FET a threshold voltage of which is controlled to be around zero volts (approximately $0\pm0.4$ V), which enables effective voltage elevation with little voltage loss. Since the capacitors 24 and 25 employ MOS structure, they can be formed concurrently with formation of other transistors in a manufacturing process of the memory cell 10, so that a special or an additional process for forming the capacitors is not required.

The control gate of the memory transistor 11 and the source of the memory transistor 12, both of which are connected to the writing circuit 20, are respectively grounded through the transistor 21 the control gate of which is connected to the word line 701. The control gate of the memory transistor 11 and the source of the memory transistor 12 are also connected through the transistor 23 to one of the electrodes of the capacitor 25, the control gate of the transistor 22 and one of the electrodes of the capacitor 24.

The control gate of the transistor 23 is not only connected to one of the electrodes of the capacitor 25 but also connected to the high voltage supplying line 702 through the transistor 22. The other electrodes of the capacitors 24 and 25 are respectively connected through the transistors 26 and 27 to the write clock pulse supplying lines 704 and 705. The gates of the transistors 26 and 27 are connected to the second bit line 711.

The writing circuit 20 as constructed above performs following operations.

The transistors 26 and 27 are driven by the signal $\overline{BL}$ with high level state forwarded from the bit line 711. In this moment, when the write clock pulses $\phi W$ and $\overline{\phi}W$ are provided from the write clock pulse supplying lines 704 and 705, the write clock pulses $\phi W$ and $\overline{\phi}W$ are respectively provided to the capacitors 24 and 25 through the transistors 26 and 27.

Since the write clock pulses $\phi W$ and $\overline{\phi}W$ are 180 degree phase shifted pulses from each other, the capacitor 25 is being discharged when the capacitor 24 is being charged in accordance with the write clock pulses $\phi W$ and $\overline{\phi}W$.

In the same way, when the capacitor 24 is being discharged, the capacitor 25 is being charged. As the result, the voltage generated by the discharge of the capacitor 24 is provided to the source of the memory transistor 12 and the control gate of the memory transistor 11, which causes a write operation into the memory transistor 12 and a concurrent erasing operation to the memory transistor 11.

In other words, the memory transistors 11 and 12 perform opposite operations as each other. The above mentioned operations are never performed in the writing circuit 20 when the word line 701 receives the signal WL0 with high level state, the bit line 711 receives the signal $\overline{BL}$ with low level state or the write circuit 20 does not receive writing clock pulses $\phi W$ and $\overline{\phi}W$. Hereinafter, the signal with high level state is expressed as "1" and low level state as "0".

The reading circuit 30 is constituted by P channel type common load transistors 31 and 32 having current-/voltage conversion and differential amplification functions, an N channel type FET transistor 33 operable under erasing operation, a detection gate 34 for detecting failure of the data read out from the memory cell 10, a writing gate 35 constituted by a tri-state invertor and a reading gate 36 constituted by a tri-state buffer.

The writing gate 35 outputs the data DA on the data bus line 712 into the bit line 711 in an inverted form in response to the writing signal WRE on the writing signal line 707. The reading gate 36 outputs the reading data on the bit line 710 into the data bus line 712 in response to the reading signal RDE.

The load transistors 31 and 32 are constituted such that their drains are respectively connected to the bit lines 710 and 711, and each of the drains is also connected to the control gates of the other transistors 31 or 32. The sources of the load transistors 31 and 32 are connected to the power source supplying line 709.

The detection gate 34 outputs the error signal ERR depending on whether the potential of the signals BL and $\overline{BL}$ on the bit lines 710 and 711 is "1", "0" or "0", "1". In other words, the detection gate 34 incorporates the function to inform CPUs or control circuits (both not shown) of deterioration or failure of the memory cell 10.

The output of the writing gate 35 is connected to the bit line 711 and the control gate of the load transistor 31. The writing gate 35 is enabled to output the provided data by receiving the writing signal WRE with "1" state from the writing signal line 707. The input of the readout gate 36 is connected to the bit line 710 and the control gate of the load transistor 32. The reading gate 36 is enabled to output the data read out from the memory cell by receiving the reading signal RDE with "1" state from the reading signal line 706.

Since these connective relations depend on whether the gates are inverted type or not, reverse connective relations are also possible. Although the input of the writing gate 35 must be preserved during writing operation, data preservation circuit, such as a flip-flop circuit, can be utilized instead, if necessary.

The erasing circuit 40, which is similar to the writing circuit 20, is constituted by N channel type FET transistors 41 and 47, zero threshold FET transistors 42, 45 and 46, and capacitors 43 and 44, whereby the erasing circuit 40 incorporates the function to generate high voltage for erasing in accordance with the high voltage VPP (for example approximately 20 V) and the clock pulses $\phi$ and $\overline{\phi}$.

The erasing circuit 40 also incorporates a logic control circuit 50. The erasing circuit 40 is constituted such that the control gate of the transistor 47 (which corresponds to the transistor 21 of the writing circuit 20) is connected to the logic control circuit 50. Corresponding electrodes e.g., drains transistors 45 and 46 (which correspond to the transistors 26 and 27 in the writing circuit 20) are connected respectively to the write clock pulse supplying lines $\phi W$ and $\overline{\phi}W$ and the logic control circuit 50 as well.

The logic control circuit 50 which is constituted by AND gates 51, 52, 54 and 55 and an OR gate 53 controls reading, writing and erasing operations of the memory cell 10. The word line selection signal WO is inputted to one set of inputs to the AND gates 51, 52, 54 and 55. The read-out mode signal RDM and the erasure mode signal ERM are also respectively inputted to the other input terminal of the AND gates 51 and 52.

In other words, the AND gate 51 outputs when the reading operation is performed, whereas the AND gate 52 outputs when erasing operation is performed. These two outputs are inputted to the OR gate 53. The output of the OR gate 53 constitutes a word signal WLO. The output of the AND gate 51 is connected to the control gate of the transistor 47.

In the similar way, the output of the AND gate 52 is connected to the control gates of the transistors 45 and 46. To the AND gates 54 and 55, there are inputted the word line selective signal WO, and also the writing mode signal WRM and the erasing mode signal ERM through the OR gate 56. The clock pulses $\phi$ and $\overline{\phi}$ are respectively inputted to the AND gates 54 and 55. In other words, the AND gates 54 and 55 perform outputting operation alternatively in response to the clock pulses $\phi$ and $\overline{\phi}$ at the time when the writing operation and the erasing operation are performed. The outputs of the AND gates 54 and 55 constitute the clock pulses $\phi W$ and $\overline{\phi}W$, respectively. The outputs of the AND gates 54 and 55 are respectively connected to one of the electrodes of the transistors 45 and 46.

Now, the operation of the EEPROM described above will be explained in details.

Figure 3:
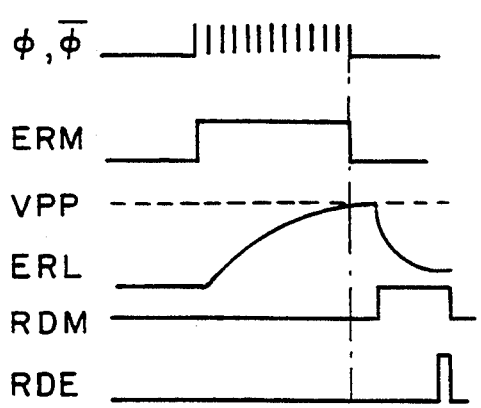
FIG. 3(a) is a timing chart illustrating erasing and reading operations for the embodiment shown in FIG. 2.
FIG. 3(b) is a timing chart illustrating writing and reading operations for the embodiment shown in FIG. 2.
Figure 3:
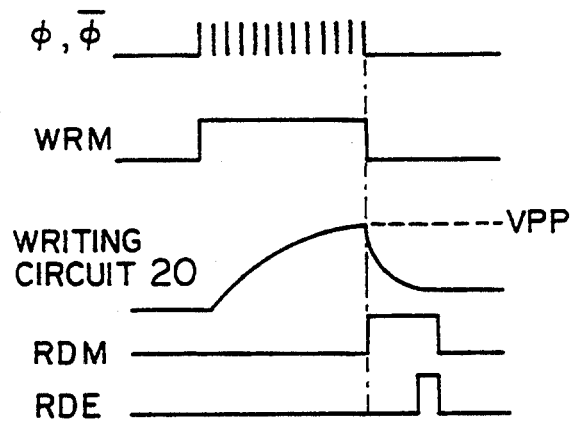

FIG. 3 is a timing chart illustrating erasing, writing and reading functions.

Figure 4:
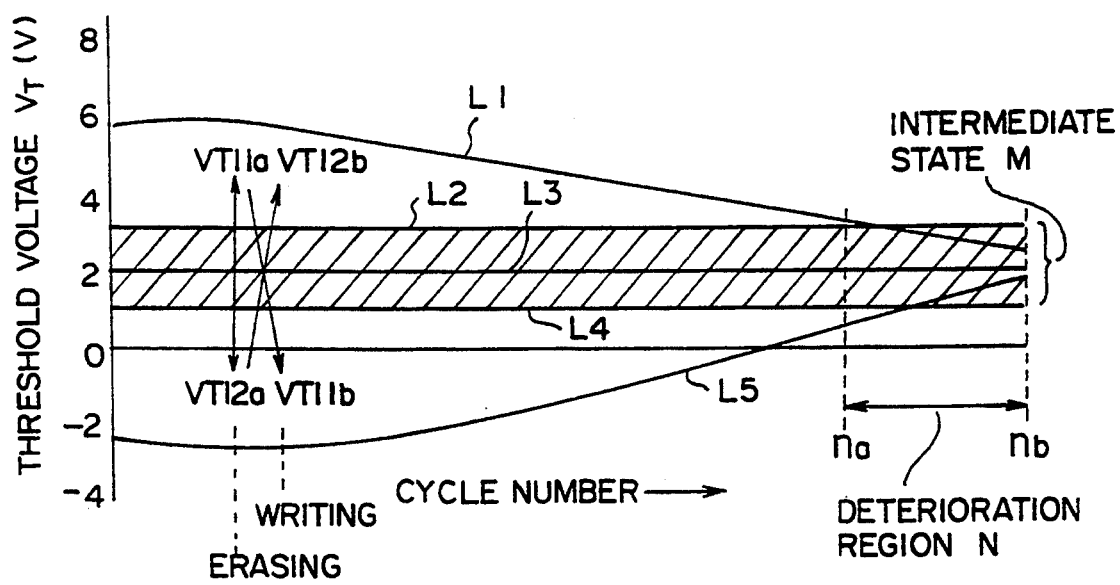
FIG. 4 is a variation chart illustrating a change of the threshold voltage $V_T$ of the memory transistor shown in FIG. 2.

FIG. 4 is a variation chart illustrating a change of the threshold voltage $V_T$ of the memory transistors 11 and 12 in the memory cell 10 shown in FIG. 2.

(1) Erasing Operation

When the data stored in the memory cell 10 is attempted to be erased, the memory cell 10 in FIG. 2 is selected by an address decoder (not shown) so that the word line selection signal WO becomes "1".

Firstly as illustrated in FIG. 3(a), a CPU (not shown) sets the erasing mode signal ERM to be "1" in order to put the EEPROM circuit erased state, whereby the transistor 33 is operated by the erasing mode signal ERM to cause the bit signal $\overline{BL}$ to be "0". As the result, the writing circuit 20 does not operate. And, the erasing mode signal ERM instructs the word signal WLO through the AND gate 52 and the OR gate 53 to be "1".

The word signal WLO actuates the transistors 13, 14 and 21 in the memory cell 10 so that the control gate of the memory transistor 11 and the source of the memory transistor 12 become 0 volt. The AND gates 54 and 55 output pulses, in response to the clock pulses $\phi$ and $\overline{\phi}$, to the transistors 41, 42, 45 and 46 and capacitors 43 and 44 through the transistors 45 and 46 which are conductive so as to operate the erasing circuit 40. The operation of the erasing circuit 40 generates the high voltage ERL for erasing at the erase voltage supplying line 703. This high voltage is provided to the source of the memory transistor 11 and the control gate of the memory transistor 12, whereby an erasing operation is performed on the memory transistor 11 and a writing operation is performed on the memory transistor 12.

This high voltage escalates the threshold voltage $V_T$ of the memory transistor 11 and reduces that of the memory transistor 12 so that, as shown in FIG. 4, the threshold voltage $V_T$ of the memory transistor 11 and the memory transistor 12 moves to the value $V_{T11a}$ and $V_{T12a}$, respectively. When the erasing mode signal ERM becomes "0", the transistors 45 and 46 in the erasing circuit 40 become inoperative so that the erasing operation will be ceased. In this moment, the threshold voltages $V_T$ of the memory transistors 11 and 12 are preserved to be the values T11a and T12a which are respectively stored in the memory transistors 11 and 12. These are defined as erasing state. In the above explanation, although erasing is mentioned to the transistor 11, writing is also mentioned to the transistor 11 so that the same explanation will be done hereinafter in respect to the transistor 11.

(2) Reading Operation After Erasure

A CPU (not shown) sets the word line selective signal WO and the reading mode signal RDM to be "1", respectively. The reading mode signal RDM actuates the transistor 47 through the AND gate 51 in the logic control circuit 50 of the erasing circuit 40 so that the erasing circuit 40 is initialized by discharging the erase voltage supplying line 703, whereby the erasing circuit 40 does not operate.

The writing circuit 20 also does not operate because the transistor 21 in the writing circuit 20 operates. Further, the word signal line WLO turns to "1" through the AND gate 51 and the OR gate 53 so that the selective transistors 13 and 14 can operate. There appears the voltage corresponding to the threshold voltage $V_T$ difference (memorized state) between the memory transistors 11 and 12 on the bit lines 710 and 711 through the selective transistors 13 and 14, which enables data reading. The voltage of the signals BL and $\overline{BL}$ appeared on the bit lines 710 and 711, although the threshold voltage $V_T$ difference is small, can be differentially amplified by the load transistors 31 and 32 so that the stored data can be read as "1" or "0". Accordingly, when a CPU (not shown) instructs the reading signal RDE to be "1", then the reading gate 36 can operate to provide the reading content to the data line DA.

The reading gate 36 in the reading circuit 30 has a threshold voltage of approximately 2 volts as illustrated in FIG. 4 so that, depending upon the potential of the bit signal BL being above or below the level L3 shown in FIG. 4, the memorized content can be read out as "1" or "0", respectively. The detection gate 34 monitors the potential of the bit signals BL and $\overline{BL}$. Further, the detection gate 34 is set such that the threshold voltages of the non-inverted terminal and the inverted terminal have L2 level, that is, approximately 3 volts, and LA level, that is approximately 1 volt, respectively. These settings can be easily realized by employing, for example, a Schmitt circuit at the input stage of the reading gate 36 and the detection gate 34, or by changing the size of the transistors.

In FIG. 4, L1 represents the threshold voltage $V_T$ in erasing state and L3 in writing state. Accordingly, when the potential of the bit signal BL is lower than L2 level or the potential of the bit signal $\overline{BL}$ is higher than LA (intermediate state M), it indicates that the threshold voltage $V_T$ of the memory cell 10 is not sufficiently changed. When the signal indicating the intermediate state M is detected, the detection gate 34 outputs the error signal ERR informing the memory cell 10 being in the deterioration region N (region where the threshold voltage $V_T$ remains in the intermediate state M at writing state or erasing state) due to deterioration. Accordingly, failure or remaining life time of the memory cell 10 can be detected beforehand.

The data read out from the memory is judged as "1" or "0" in comparison with 2 volts, as described above, so that even after the error signal ERR is outputted, considerable numbers of reading operation (up to numbers Na to Nb shown in FIG. 4) can be performed correctly to the extent that the threshold voltage $V_T$ difference is detectable between at the writing state and at the erasing state, which expands the life time of the memory cell 10.

Further, in the operation of the EEPROM circuit, even though either of memory transistors 11 or 12 becomes defective, or the potential of one of bit signals BL and $\overline{BL}$ falls into the intermediate state M as illustrated in FIG. 4, reading out operation of data can be correctly performed unless the other bit signal $\overline{BL}$ or BL falls simultaneously into the intermediate state M, thereby compensating the default of the memory cell 10.

(3) Writing Operation

A CPU (not shown) instructs the word line selective signal WO and the writing mode signal WRM to set "1". In response to the writing mode signal WRM, the clock pulses $\phi$ and $\overline{\phi}$ are provided, through the AND gates 54 and 55 in the logic control circuit 50, as the write clock pulses $\phi W$ and $\overline{\phi}W$. In this moment, since the transistors 26 and 27 are in conductive state, the write clock pulses $\phi W$ and $\overline{\phi}W$ actuate the writing circuit 20, whereas the erasing circuit 40 does not operate because of the transistors 45 and 46 being inoperative.

In response to the operation of the writing circuit 20, high voltage from the high voltage source VPP is provided to the control gate of the transistor 11 and the source of the memory transistor 12 so that data are written into the memory transistor 11 and data are erased from the memory transistor 12. This high voltage contributes such that the threshold voltage $V_T$ of the memory transistor 11 becomes low and the threshold voltage $V_T$ of the memory transistor 12 becomes high. Accordingly, as illustrated in FIG. 4, the threshold voltages of each memory transistors 11 and 12 vary from the value $V_T11a$ toward $V_T11b$ and from $V_T12a$ toward $V_T12b$, respectively.

When a CPU (not shown) instructs the writing signal WRE to be "1", the writing buffer 35 becomes operative and transmits the content, which is provided from the data bus line DA, through the load transistors 31 and 32 to the bit line 710 and 711. However, when the bit signal $\overline{BL}$ stays "0", the transistors 26 and 27 stay inoperative state and the writing circuit 20 does not operate because the memory cell 10 has already been in erasure state.

As the result, writing operation is performed when the bit signal $\overline{BL}$ is "1" and the bit signal BL is "0", whereby an appropriate access function will be performed. When the writing mode signal WRM becomes "0", the write clock pulses $\phi W$ and $\overline{\phi}W$ are not provided so that the aforementioned writing operation will be ceased. In this instance, since the threshold voltages $V_T$ of the memory transistors 11 and 12 are respectively stored in the memory transistors 11 and 12 to preserve the values $V_T11b$ and $V_T12b$ as illustrated in FIG. 4, which shows data written state. The writing circuit 20 performs an opposite operation relative to erasure to the memory transistors 11 and 12.

(4) Reading Operation After Writing

A CPU (not shown) instructs the bit line selective signal WO and the reading mode signal RDM to set "1" in a way similar to that described in the reading operation. The reading mode signal RMD activates the transistor 47 through the AND gate 51 of the logic control circuit 50 in the erasing circuit 40, so that the writing circuit 20 discharges to be initialized and inoperative. Since the transistor 47 of the erasing circuit 40 becomes operative, the erasing circuit 40 becomes inoperative. Further, the selective transistors 13 and 14 become operative and data can be read out. Further operations are similar as the reading operations described in paragraph (2).

According to the first embodiment, rewriting data into the memory cell is performed such that firstly data stored in a plurality of memory cells connected to the word line 701 are erased simultaneously and secondly data are written to the memory transistors 11 and 12 constituting the target memory cell in accordance with the data input.

Next, the second embodiment of the present invention will be explained.

Figure 5:
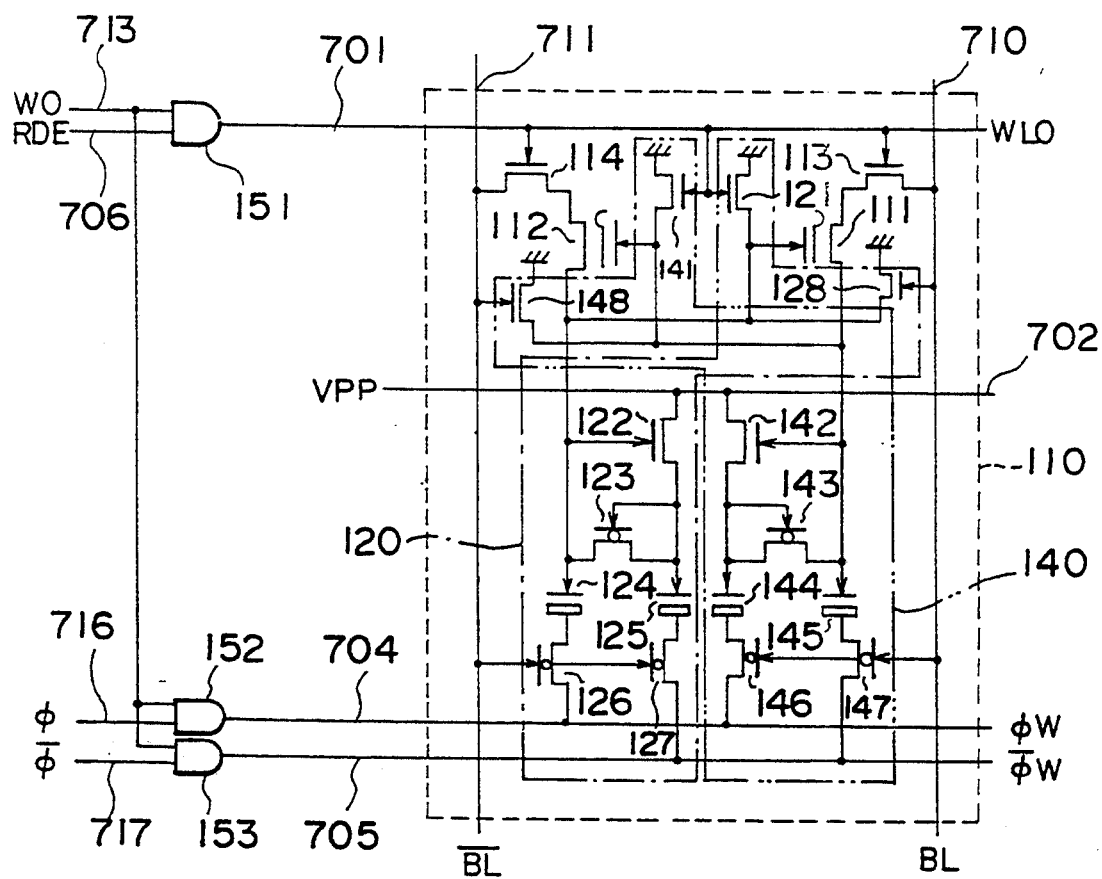
FIG. 5 is a circuit diagram of the memory cell illustrating the second embodiment of the present invention.

FIG. 5 is a circuit diagram of the memory cell illustrating the second embodiment according to the present invention. The memory cell 110 incorporates similar memory transistors 11 and 12 and selective transistor 13 and 14 as in FIG. 2. The memory cell 110 also employs a similar writing circuit 120 which provides writing voltage to the memory transistors 11 and 12. Further, the memory cell 110 employs an erasing circuit 140 which has identical circuit structure to the writing circuit 120.

As described above, since there are disposed the erasing circuit 140 and the writing circuit 120 in the memory cell 110, data erasing and data writing are selectively controlled each by each memory cell 110 in accordance with the data input from the bit lines BL and $\overline{BL}$, whereby writing and erasing operations can be simultaneously performed to a plurality of the memory cells 110 connected to the same word line. In other words, data can be easily rewritten simply by selecting the word line WLO in response to the word line selective signal WO and providing the clock pulses $\phi$ and $\overline{\phi}$. In case of reading, the selective transistors 13 and 14 are selected by providing the reading signal RDE to the word line WLO which is selected by the word line selective signal WO.

This second embodiment has the following advantages as well as the similar advantages as those of the first embodiment. Although the area size of the memory cell 110 increases because of the writing circuit 120 and the erasing circuit 140 being disposed inside the memory cell 110, simultaneous writing and reading to and from the memory cell 110 which is connected to the same word line can be performed, so that writing and erasing time can be reduced.

The control gate of the memory transistor 111 and the source of the memory transistor 112 are connected to the writing circuit 120. The source of the memory transistor 111 and the control gate of the memory transistor 112 are connected to the erasing circuit 140. The drains of the memory transistors 111 and 112 are respectively, through the selective transistors 113 and 114, connected to the bit lines 710 and 711. The control gates of the selective transistor 113 and 114 are connected to the word line 701. The transistors 126 and 127 in the writing circuit 120 in FIG. 5 respectively correspond to the transistors 26 and 27 in the writing circuit 20 in FIG. 2. The transistor 121 also corresponds to the transistor 21. In the same way, the transistors 146 and 147 in the reading circuit 140 correspond to the transistors 26 and 27 in the writing circuit 20 in FIG. 2. Also, the transistor 141 corresponds to the transistor 21. The control gates of the transistors 126 and 127 in the writing circuit 120 are connected to the bit line 711 and the control gates of the transistor 146 and 147 in the erasing circuit 140 are connected to the bit line 710. Further, each one of the electrodes of the transistor 126 in the writing circuit 120 and the transistor 146 in the erasing circuit 140 is connected to the write clock pulse 704. And, each one of the electrodes of the transistor 127 in the writing circuit 120 and the transistor 147 in the erasing circuit 140 is connected to the write clock pulse 705.

In FIG. 5, when line 701 carries a high WLO signal, transistor 121 in writing circuit 120 and transistor 141 in erasing circuit 140 both turn on. When transistor 121 turns on, it provides a path from ground to the control gate of memory transistor 111 and to the source of memory transistor 112. When transistor 141 turns on, it provides a path from ground to the control gate of memory transistor 112 and the source of memory transistor 111. Further n-type transistors 128 and 148 are respectively employed in writing circuit 120 and erasing circuit 140. The control electrode of transistor 128 is connected to bit line 710, and when transistor 128 is turned on, it provides a path from ground to the control gate of memory transistor 111 and the source of memory transistor 112. Correspondingly, transistor 148 has its gate electrode coupled to the complementary bit line 711 so that when transistor 148 is turned on, it provides a path from ground to the control electrode of memory transistor 112 and to the source electrode with memory transistor 111.

Now, the third embodiment of the present invention will be explained.

Figure 6:
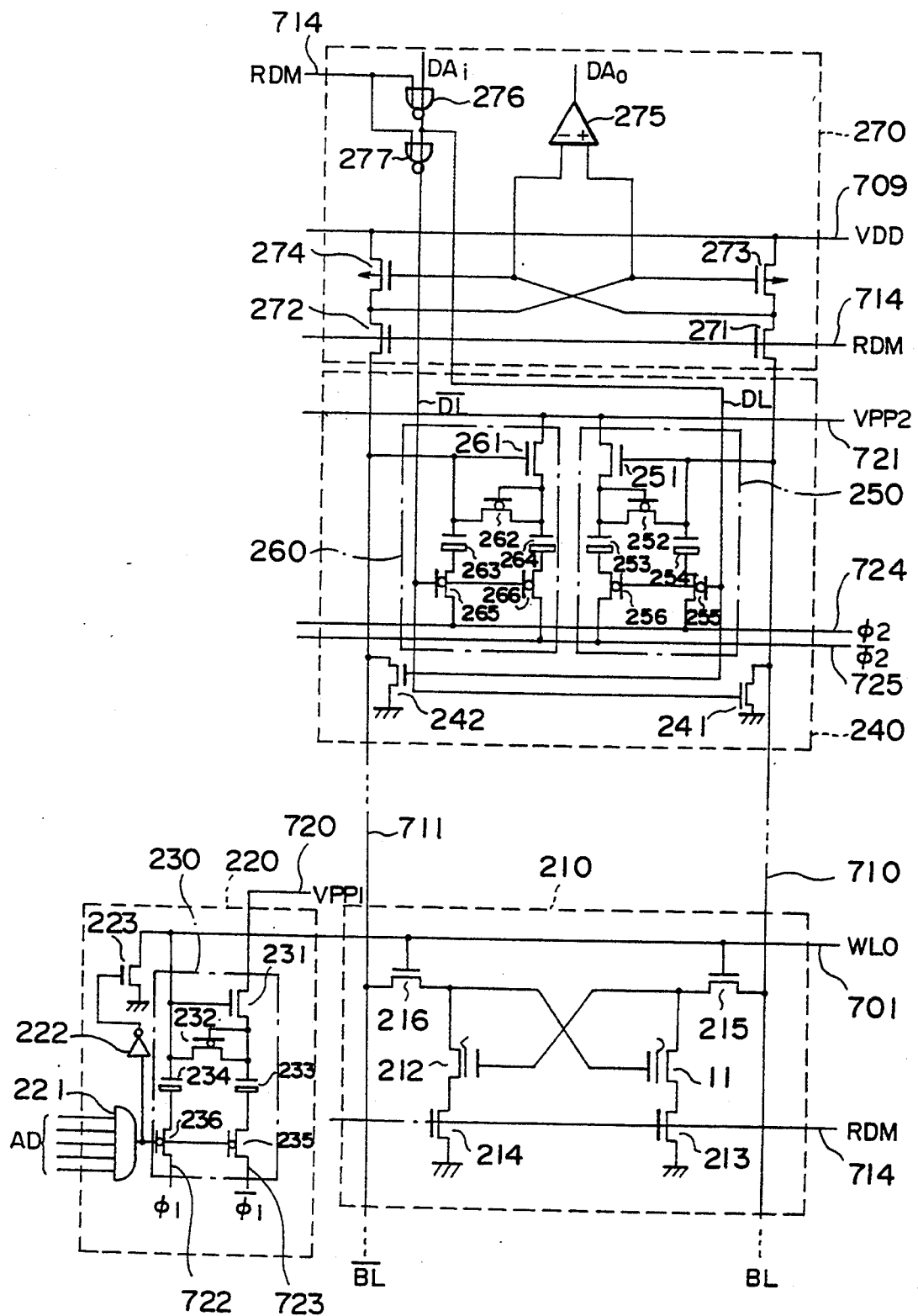
FIG. 6 is a partial circuit diagram illustrating the third embodiment of the present invention.

FIG. 6 is a circuit diagram illustrating the third embodiment according to the present invention. This EEPROM circuit incorporates a memory cell 210, a word selector 220, a writing/erasing circuit 240 and an input/output circuit 270.

The word selector 220 selects the word line 701 in response to the address AD. The writing/erasing circuit 240 erases or writes data in the memory cell by generating high voltage for writing or erasing to the memory cell 210. The input/output circuit 270 inputs data DAi or outputs data DAo. The memory cell 210 is connected to the bit lines 710 and 711, the word line 701 and the reading signal line 714. The word selector 220 is connected to the high voltage supplying line 720, the clock pulse supplying lines 722 and 723 and the word line 701. The word selector 220 has the address signal AD as an input. The writing/erasing circuit 240 is connected to the bit lines 710 and 711, the high voltage supplying line 721, the clock pulse supplying lines 724 and 725 and the data lines DL and $\overline{DL}$. The input/output circuit 270 having the writing data DAi as an input and the reading data DAo as an output is connected to the bit lines BL and $\overline{BL}$, the power source voltage VDD and the reading mode signal RDM. The memory cell 210 is constituted by floating gate type first and second memory transistors 211 and 212, N channel type first and second FET reading transistors 213 and 214 and N channel type first and second FET selective transistors 215 and 216.

The control gates of the memory transistors 211 and 212 are respectively connected through the selective transistors 216 and 215 to the bit lines $\overline{BL}$ and BL. The drains of the memory transistors 211 and 212 are respectively connected to the control gates of the memory transistors 212 and 211. The sources of the memory transistors 211 and 212 are respectively connected through the reading transistors 213 and 214 to the ground. The control gates of the selective transistors 215 and 216 are connected to the word line WLO. The control gates of the reading transistors 213 and 214 are connected to the reading mode signal RDM.

The word selector 220 is constituted by the address decoder 221, the inverter 222, the N channel type FET transistor 223 for discharging and the high voltage switching circuit 230. The address decoder 221 decodes the address signal AD. The invertor 222 and the discharging transistor 223 discharge the word line WLO in response to the output of the address decoder 221 to initialize the high voltage switching circuit 230. The high voltage switching circuit 230 generates high voltage on the word line WLO in response to the output of the address decoder 221.

This high voltage switching circuit 230 corresponding to the writing circuit 20 in FIG. 2 is constituted by an N channel type FET transistor 231, zero threshold FET transistors 232, 235 and 236 and capacitors 233 and 234. The transistors 235 and 236 in the high voltage switching circuit 230 correspond to the transistors 26 and 27 in the writing circuit 20 in FIG. 1. The output of the address decoder 221 is connected through the inverter 222 to the control gate of the discharging transistor 223. Further, the output of the address decoder 221 is connected to the control gates of the transistors 235 and 236 in the high voltage switching circuit 230. One of the electrodes of each transistors 235 and 236 is connected to the clock pulses $\phi1$ and $\overline{\phi1}$ and the word line WLO is grounded through the discharging transistor 223. Further, the control gate of the transistor 231 in the high voltage switching circuit 230 is connected to the word line WLO. One of the electrodes of the transistor 231 is connected to the high voltage VPP1.

The writing/erasing circuit 240 is constituted by an N channel type FET transistors 241 and 242 for discharging, a writing circuit 250 and an erasing circuit 260. The discharging transistors 241 and 242 discharges the bit lines BL and $\overline{BL}$ in response to the potential of the data lines $\overline{DL}$ and DL. The bit lines BL and $\overline{BL}$ are respectively grounded through the discharging transistors 241 and 242. The control gates of the discharging transistors 241 and 242 are connected to the data lines $\overline{DL}$ and DL.

The writing circuit 250 which has an identical circuit structure to the high voltage switching circuit 230 is constituted by an N channel type FET transistor 251, capacitors 253 and 254, and zero threshold FET transistors 252, 255 and 256. The erasing circuit 260 which has also an identical circuit structure to the high voltage switching circuit 250 is constituted by a transistor 261, capacitors 263 and 264 and transistors 262, 265 and 266. The transistors 255 and 256 in the writing circuit 250 and the transistors 265 and 266 respectively correspond to the transistors 235 and 236 in the high voltage switching circuit 230. The control gates of the transistors 255 and 256 in the writing circuit 250 are connected to the data line $\overline{DL}$. The control gates of the transistors 265 and 266 in the erasing circuit 260 are connected to the data line $\overline{DL}$. One of each electrodes of the transistor 255 in the writing circuit 250 and the transistor 265 in the erasing circuit 260 is connected to the clock pulse $\phi 2$. One of each electrodes of the transistor 256 in the writing circuit 250 and the transistor 266 in the erasing circuit is connected to the clock pulse $\phi 2$. The control gates of the transistor 251 in the writing circuit 251 and the transistor 261 in the erasing circuit 260 are respectively connected to the bit lines BL and $\overline{BL}$. One of each electrodes of the transistors 251 and 261 is connected to the high voltage VPP2.

The input/output circuit 270 incorporates N channel type FET transistors 271 and 272 for discharging and P channel type FET load transistors 273 and 274. The input/output circuit 270 further incorporates a sense amplifier 275 for outputting the reading data DAo and NOR gates 276 and 277 for outputting the writing data DAi. The bit line BL is connected to the power source voltage VDD through the transistors 271 and 273. The bit line $\overline{BL}$ is connected to the power source voltage VDD through the transistors 272 and 274. The control gates of the transistors 271 and 727 are connected to the reading mode signal RDM. The control gates of the transistors 273 and 274 are connected to the non-inverted and the inverted input terminals respectively as well as one of each electrodes of the transistors 274 and 273.

The sense amplifier 275 has the output DAo. The NOR gates 276 and 277 have the reading mode signal as an input. The NOR 276 has the writing data DAi as the other input and the NOR 277 has the output from the NOR 276 as the other input. Further, the output of the NOR 276 is provided to the data line DL and the output of the NOR 277 is provided to the data line $\overline{DL}$.

The EEPROM circuit described above operates in the following manner.

Figure 7:
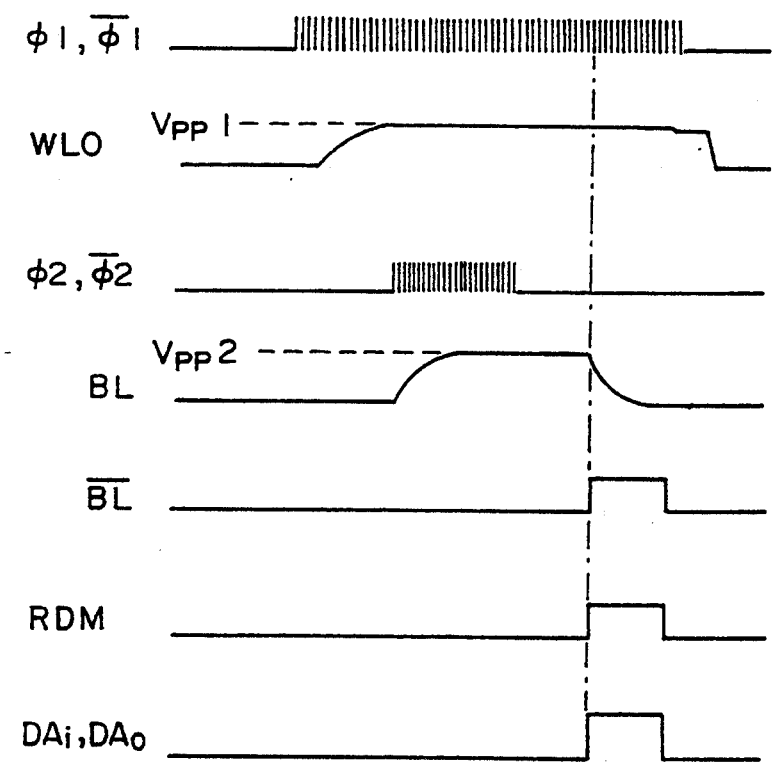
FIG. 7 is a timing chart illustrating erasing, reading and writing operations for the embodiment shown in FIG. 6.

FIG. 7 is a timing chart of the EEPROM circuit shown in FIG. 6. When the clock pulses $\phi 1$ and $\phi 2$ are firstly provided, only the high voltage switching circuit 230 selected by the output of, for example, the address decoder 221 is activated so as to provide the high voltage VPP1 to the word line WL0. Then, the selective transistors 215 and 216 in the memory cell 210 operate to have the memory cell 210 be in a selected state. Next, when the clock pulses $\phi 2$ and $\phi 2$ are provided to the writing/erasing circuit 240, either the writing circuit 250 or the erasing circuit 260 operates in response to the input data to charge up the bit line BL or the bit line $\overline{BL}$ to the high voltage VPP2 level. In this moment, the bit line $\overline{BL}$ or BL is turned to be 0 volt by the transistors 241 and 242. Accordingly, the threshold voltage $V_T$ of the transistor 211 becomes low in accordance with the writing data DAi so that data writing is performed in the direction to which the threshold voltage $V_T$ of the transistor 212 increases or data erasing is performed in the direction to which the threshold voltage $V_T$ of the transistor 212 increases as well as the threshold voltage $V_T$ of the transistor decreases.

When the reading mode signal RDM is provided, the transistors 213 and 214 operate in the memory cell 210, whereby the source voltages of the memory transistors 211 and 212 become 0 volt and the memory content stored in the transistors 211 and 212, that is, the current corresponding to the threshold voltages $V_T$ of the transistors 211 and 212 will pass through the selective transistors 215 and 216 to the bit lines BL and $\overline{BL}$. In this moment, since the transistors 271 and 272 in the input/output circuit 270 are activated by the reading mode signal RDM, the current passing through the bit lines BL and $\overline{BL}$ is differentially amplified in the voltage form by the load transistors 273 and 274. Then, the non-inverted and the inverted input terminals of the sense amplifier 275 receive potential difference corresponding to the threshold voltage $V_T$ difference between the memory transistors 211 and 212. Accordingly, even if the voltage of the bit line BL is slightly higher or lower than that of the bit line $\overline{BL}$, "1" or "0" can be read as the data DAo from the sense amplifier 275.

When the word line selection signal WL0 is terminated, the word line WL0 is discharged to be 0 volt by the transistor 223 in the word selector 220 so that the circuit structure of the memory cell or its peripheral circuit can be simplified enough to be integrated.

The present invention is not limited to the above mentioned embodiments and several modifications can be possible, for example, as follows:

(a) Although the reading buffer 36 is employed in the reading circuit 30 in FIG. 2 for reading data, other circuits can also be employed for reading data.

Figure 8:
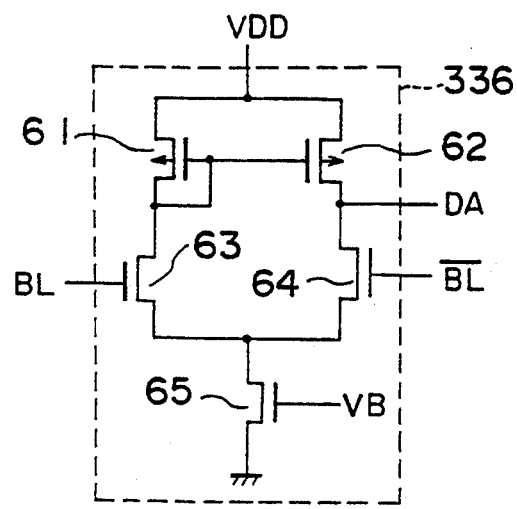
FIG. 8 is a circuit diagram of a differential-type amplifier utilized in the embodiment shown in FIG. 1.

FIG. 8 is a circuit diagram of a differential sense amplifier 336 which comprises P channel type load FET transistors 61 and 62, N channel type FET transistors 63 and 64 for acquiring differential voltage between the bit lines BL and $\overline{BL}$, and an N channel type constant current power source FET transistor 65 to which the reference voltage VB is provided. One of the electrodes of the load transistors 61 and 62 is connected to the power source voltage VDD. The other electrode of the load transistor 61 is connected to one of the electrodes of the transistor 63 as well as to the control gates of the load transistors 61 and 62. The other electrode of the load transistor 62 is connected to one of the electrodes of the transistor 64 as well as to the data bus line DA. The other electrodes of the transistors 63 and 64 are connected to one electrode of the constant current source transistor 65. The control gates of the transistors 63 and 64 are respectively connected to the bit lines BL and $\overline{BL}$. The other electrode of the constant current source transistor 65 is grounded and the control gate is connected to the reference voltage VB.

Instead of the reading gate 36 in FIG. 2, if this kind of the differential sense amplifier 136 is utilized to detect potential difference between the bit lines BL and $\overline{BL}$, more accurate reading for the data DA can be realized, though the circuit structure is complicated in comparison with the reading gate 36 in FIG. 2.

(b) The writing circuit 20 shown in FIG. 2 can be incorporated externally from the memory cell 10. Alternatively, the memory cell 10 incorporates the erasing circuit 40 internally and the writing circuit 40 can be incorporated externally from the memory cell 10. Either has the similar advantages as those of the first embodiment.

(c) The memory cells 10 and 110, the writing circuits 20 and 120, the reading circuit 30, and the erasing circuits 40 and 130 as shown in FIG. 2 and FIG. 5 can be modified to another circuit structure not shown above by utilizing another type of transistors and gates.

(d) The logic control circuit 50 incorporated internally into the erasing circuit 40 shown in FIG. 2 can be incorporated externally.

We claim:

1. An EEPROM circuit for storing data into a memory cell comprising:

a pair of complementary bit lines;

at least one high voltage supply line distinct from the bit line pair;

a memory cell having first and second semiconductor memory elements for storing data, each said element having a respective gate electrode and source electrode;

a first writing circuit for writing data into said first semiconductor memory element by providing high voltage thereto from the at least one high voltage supply line, the first writing circuit being connected to said gate electrode of the first semiconductor memory element and to said source electrode of the second semiconductor memory element, the first writing circuit being controlled in operation by either one of the bit line pair;

a second writing circuit for writing data into the second semiconductor memory element by providing high voltage thereto from the at least one high voltage supply line, the second writing circuit being connected to said gate electrode of the second semiconductor memory element and said source electrode of the first semiconductor memory element;

a reading circuit for reading data from the memory cell, the reading circuit reading data stored in the first and second semiconductor memory elements through the bit line pair, and recognizing the data stored in the memory cell in accordance with the respective data; and a logic control circuit for controlling an operation of the memory cell, the logic control circuit providing the first and second writing circuits with a signal for controlling a supply of the high voltage.

2. The EEPROM circuit set forth in claim 1, wherein the first writing circuit is effective to write data into the first semiconductor memory element and concurrently to erase data stored in the second semiconductor memory element.

3. The EEPROM circuit set forth in claim 1, wherein the second writing circuit writes data into the second semiconductor memory element and concurrently erases data stored in the first semiconductor memory element.

4. The EEPROM circuit set forth in claim 3 further comprising a second high voltage providing line, wherein the second writing circuit provides said high voltage to said second high voltage providing line for erasing data from the first semiconductor memory element.

5. The EEPROM circuit set forth in claim 1, wherein the memory cell incorporates a selected one of the first and the second writing circuit and wherein the high voltage for writing data is controlled in accordance with a status of a said bit line.

6. The EEPROM circuit set forth in claim 1, wherein the reading circuit incorporates a reading gate outputting data in accordance with a request signal for reading.

7. The EEPROM circuit set forth in claim 6, wherein the reading gate is a tri-state buffer.

8. The EEPROM circuit set forth in claim 6, wherein the reading gate is a differential amplifier.

9. The EEPROM circuit set forth in claim 1, wherein said first writing circuit includes two capacitors complementarily charging and discharging in accordance with a clock pulse signal forwarded in a writing operation.

10. The EEPROM circuit set forth in claim 9, wherein the two capacitors are MOS capacitors.

11. The EEPROM circuit set forth in claim 9, wherein the clock pulse signal inputted to the two capacitors comprises two complementary clock pulse signals.

12. The EEPROM circuit set forth in claim 10, wherein the clock pulse signal inputted to the two capacitors is inputted through a transistor controlled in operation by either one of the bit lines.

13. The EEPROM circuit set forth in claim 1, wherein the second writing circuit includes two capacitors complementarily charging and discharging in accordance with a clock pulse signal forwarded in a writing operation.

14. The EEPROM circuit set forth in claim 13, wherein the two capacitors are MOS capacitors.

15. The EEPROM circuit set forth in claim 13, wherein the clock pulse signal inputted to the two capacitors comprises two complementary clock pulse signals.

16. The EEPROM circuit set forth in claim 15, wherein the clock pulse signal inputted to the two capacitors is inputted through a transistor controlled in operation by the logic control circuit.

17. An EEPROM circuit for storing data into a memory cell comprising:

a pair of complementary bit lines;

at least one high voltage supply line distinct from the bit line pair:

a memory cell having first and second semiconductor memory elements for storing data, each said element having a respective gate electrode and source electrode;

a first writing circuit for writing data into the first semiconductor memory element by providing high voltage from the at least one high voltage supply line, the first writing circuit being connected to said gate electrode of the first semiconductor memory element and to said source electrode of the second semiconductor memory element, and controlled in operation by either one of the bit line pair;

a second writing circuit for writing data into the second semiconductor memory element by providing high voltage from the at least one high voltage supply line, the second writing circuit being connected to said gate electrode of the second semiconductor memory element and to said source electrode of the first semiconductor memory element, and controlled in operation by another one of the bit line pair;

a reading circuit for reading data from the memory cell, the reading circuit reading respective data stored in the first and second semiconductor memory elements through said bit line pair and recognizing the data stored in the memory cell in accordance with the read-out data from the first and second memory elements; and a logic control circuit for controlling an operation of the memory cell, the logic control circuit providing the first and second writing circuits with a signal for controlling a supply of the high voltage.

18. The EEPROM circuit set forth in claim 17, wherein the first writing circuit writes data into the first semiconductor memory element and concurrently erases data stored in the second semiconductor memory element.

19. The EEPROM circuit set forth in claim 18, wherein the first writing circuit provides high voltage for erasing data from the second semiconductor memory element of the memory cell.

20. The EEPROM circuit set forth in claim 17, wherein the second writing circuit writes data into the second semiconductor memory element and concurrently erases data stored in the first semiconductor memory element.

21. The EEPROM circuit set forth in claim 20, wherein the second writing circuit provides said high voltage for erasing data from the first semiconductor memory element.

22. The EEPROM circuit set forth in claim 17, wherein the memory cell includes a selected one of the first and the second writing circuits and wherein the high voltage for writing data is controlled in accordance with a status of a said bit line.

23. The EEPROM circuit set forth in claim 17, wherein the memory cell includes both the first and the second writing circuit and wherein said high voltage for writing data is controlled in accordance with a status of a said bit line.

24. The EEPROM circuit set forth in claim 17, wherein the reading circuit includes a reading gate outputting data in accordance with a request signal for reading.

25. The EEPROM circuit set forth in claim 24, wherein the reading gate is a tri-state buffer.

26. The EEPROM circuit set forth in claim 24, wherein the reading gate is a differential amplifier.

27. The EEPROM circuit set forth in claim 17, wherein the first writing circuit includes two capacitors complementarily charging and discharging in accordance with a clock pulse signal provided in a writing operation.

28. The EEPROM circuit set forth in claim 27, wherein the two capacitors are MOS capacitors.

29. The EEPROM circuit set forth in claim 27, wherein the clock pulse signal inputted to the two capacitors includes a pair of complementary clock pulses.

30. The EEPROM circuit set forth in claim 29, wherein the clock pulse signal inputted to the two capacitors is inputted through a transistor controlled in operation by either one of the bit lines.

31. The EEPROM circuit set forth in claim 17, wherein the second writing circuit incorporates two capacitors complementarily charging and discharging in accordance with a clock pulse signal forwarded in a writing operation.

32. The EEPROM circuit set forth in claim 31, wherein the two capacitors are MOS capacitors.

33. The EEPROM circuit set forth in claim 31, wherein the clock pulse signal inputted to the two capacitors includes a pair of complementary signals.

34. The EEPROM circuit set forth in claim 29, wherein the clock pulse signal inputted to the two capacitors is inputted through a transistor controlled in operation by the logic control circuit.

35. An EEPROM circuit for storing data into a memory cell comprising:

a pair of complementary bit lines;

a memory cell having first and second semiconductor memory elements for storing data;

a first writing/erasing circuit having first and second capacitors, either for writing data into the memory cell or erasing data stored in the memory cell by providing high voltage generated by complementarily charging and discharging the first and second capacitors in accordance with a clock pulse signal, said high voltage being provided to both of said semiconductor memory elements in such a manner that when data is written to the first semiconductor memory element, data stored in the second semiconductor memory element is erased, and such that when data is erased from the first semiconductor memory element, data is stored into the second semiconductor memory element;

an input/output circuit for either inputting data into the memory cell or outputting data from the memory cell in such a manner that when data is being input, the writing/erasing circuit is in a data writable state with respect to said first or second semiconductor memory elements, and such that when data is being outputted, data stored in said first and second semiconductor memory elements are read-out through the bit line pair and recognized as the data stored in the memory cell; and a word selector circuit for enabling data stored in the memory cell to be readable, the word selector being effective to control the coupling of data stored in said first and second semiconductor memory elements to the bit line pair respectively in accordance with an address information.

36. The EEPROM circuit set forth in claim 35, wherein the writing/erasing circuit incorporates a first and a second high voltage generation circuit; wherein the first high voltage generation circuit provides high voltage to a gate electrode of the first semiconductor memory element and a source electrode of the second semiconductor memory element; and wherein the second high voltage generation circuit provides high voltage to a source electrode of the first semiconductor memory element and a gate electrode of the second semiconductor memory element.

37. The EEPROM circuit set forth in claim 35, wherein the two bit lines are complementary and the writing/erasing circuit performs a writing or erasing operation in accordance with potential of the said pair of bit lines.

38. The EEPROM circuit set forth in claim 37, wherein the two capacitors are MOS capacitors.

39. The EEPROM circuit set forth in claim 37, wherein the clock pulse signal inputted to the two capacitors includes a pair of complementary signals.

40. The EEPROM circuit set forth in claim 36, wherein the word selector incorporates two capacitors complementarily charging and discharging in accordance with a second clock pulse signal forwarded in a reading operation.

41. The EEPROM circuit set forth in claim 40, wherein the two capacitors are MOS capacitors.

42. The EEPROM circuit set forth in claim 41, wherein the second clock pulse signal inputted to the two capacitors is inputted through a transistor having an operation which is controlled by address information.

43. The EEPROM circuit set forth in claim 36, wherein a gate electrode of the first semiconductor memory element is connected to a source electrode of the second semiconductor memory element, and a source electrode of the first semiconductor memory element is connected to a gate electrode of the second semiconductor memory element.

* * * * *